United States Patent
Terada et al.

(10) Patent No.: US 8,436,301 B2
(45) Date of Patent: May 7, 2013

(54) TRANSMISSION ELECTRON MICROSCOPE HAVING ELECTRON SPECTROMETER

(75) Inventors: Shohei Terada, Hitachinaka (JP); Yoshifumi Taniguchi, Hitachinaka (JP); Tatsumi Hirano, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/133,653

(22) PCT Filed: Nov. 11, 2009

(86) PCT No.: PCT/JP2009/005999
§ 371 (c)(1),
(2), (4) Date: Jun. 8, 2011

(87) PCT Pub. No.: WO2010/067512
PCT Pub. Date: Jun. 17, 2010

(65) Prior Publication Data
US 2011/0240854 A1    Oct. 6, 2011

(30) Foreign Application Priority Data
Dec. 9, 2008   (JP) .............................. 2008-312809

(51) Int. Cl.
*H01J 37/26*   (2006.01)

(52) U.S. Cl.
USPC ........... 250/310; 250/306; 250/307; 250/308; 250/311

(58) Field of Classification Search .............. 250/306, 250/307, 308, 310, 311
See application file for complete search history.

(56) References Cited

U.S. PATENT DOCUMENTS

| 5,414,261 | A  | * | 5/1995 | Ellisman et al. | 250/311 |
| 5,798,524 | A  | * | 8/1998 | Kundmann et al. | 250/305 |
| 6,150,657 | A  | * | 11/2000 | Kimoto et al. | 250/305 |
| 6,184,524 | B1 | * | 2/2001 | Brink et al. | 250/305 |
| 6,448,556 | B1 | * | 9/2002 | Cowley et al. | 250/311 |

(Continued)

FOREIGN PATENT DOCUMENTS

| JP | 10-302700 A | 11/1998 |
| JP | 2000-515675 A | 11/2000 |

(Continued)

OTHER PUBLICATIONS

Extended European search report issued Jun. 1, 2012 in European Patent Application No. 09831620.1.

*Primary Examiner* — David A Vanore
(74) *Attorney, Agent, or Firm* — Miles & Stockbridge P.C.

(57) ABSTRACT

In a spectral image formed by two orthogonal axes, one of which is an axis of the amount of energy loss and the other of which is an axis of positional information, by the use of an electron spectrometer and a transmission electron microscope, distortion in the spectral image of a sample to be analyzed is corrected with high efficiency and high accuracy by comparing electron beam positions calculated from a two-dimensional electron beam position image formed by the two orthogonal axes (the axis of the amount of energy loss and the axis of positional information) with reference electron beam positions, and calculating amounts of the distortion based on the differences of the electron beam positions. Method and apparatus are offered which correct distortion in a spectral image with high efficiency and high accuracy, the image being formed by the two orthogonal axes (the axis of the amount of energy loss and the axis of positional information).

8 Claims, 11 Drawing Sheets

U.S. PATENT DOCUMENTS

| | | | |
|---|---|---|---|
| 7,030,389 B2 * | 4/2006 | Kaneyama | 250/399 |
| 7,372,029 B2 * | 5/2008 | Tsuneta et al. | 250/311 |
| 7,777,185 B2 * | 8/2010 | de Jonge | 250/311 |
| 7,888,641 B2 * | 2/2011 | Terada et al. | 250/310 |
| 7,939,801 B2 * | 5/2011 | Kasai et al. | 250/311 |
| 8,203,120 B2 * | 6/2012 | Zewail | 250/310 |
| 2002/0096632 A1 | 7/2002 | Kaji et al. | |
| 2008/0203296 A1 | 8/2008 | Terada et al. | |
| 2009/0045340 A1 * | 2/2009 | Terada et al. | 250/311 |
| 2009/0242766 A1 * | 10/2009 | Terada et al. | 250/311 |
| 2011/0095182 A1 * | 4/2011 | Terada et al. | 250/305 |
| 2011/0240854 A1 * | 10/2011 | Terada et al. | 250/307 |
| 2012/0104253 A1 * | 5/2012 | Tsuneta et al. | 250/307 |

FOREIGN PATENT DOCUMENTS

| | | |
|---|---|---|
| JP | 2002-157973 A | 5/2002 |
| JP | 2003-022774 A | 1/2003 |
| WO | WO 98/06125 A1 | 2/1998 |

* cited by examiner

ENERGY DISPERSION AXIS

⊗ y-AXIS

| #1 | | #2 | | #3 | | #4 | | #5 | |
|---|---|---|---|---|---|---|---|---|---|
| X | Y | X | Y | X | Y | X | Y | X | Y |
| 204 | 447 | 625 | 450 | 1039 | 446 | 1449 | 449 | 1848 | 455 |
| 203 | 691 | 620 | 691 | 1034 | 693 | 1441 | 689 | 1839 | 691 |
| 200 | 924 | 616 | 922 | 1025 | 922 | 1429 | 932 | 1825 | 924 |
| 203 | 1162 | 615 | 1158 | 1025 | 1157 | 1431 | 1155 | 1823 | 1158 |
| 204 | 1423 | 617 | 1411 | 1030 | 1418 | 1433 | 1413 | 1824 | 1420 |

(PIXELS)

(b)

| #1 | | #2 | | #3 | | #4 | | #5 | |
|---|---|---|---|---|---|---|---|---|---|
| X | Y | X | Y | X | Y | X | Y | X | Y |
| 200 | 484 | 600 | 484 | 1000 | 484 | 1400 | 484 | 1800 | 484 |
| 200 | 704 | 600 | 704 | 1000 | 704 | 1400 | 704 | 1800 | 704 |
| 200 | 924 | 600 | 924 | 1000 | 924 | 1400 | 924 | 1800 | 924 |
| 200 | 1144 | 600 | 1144 | 1000 | 1144 | 1400 | 1144 | 1800 | 1144 |
| 200 | 1364 | 600 | 1364 | 1000 | 1364 | 1400 | 1364 | 1800 | 1364 |

(PIXELS)

(c)

| #1 | | #2 | | #3 | | #4 | | #5 | |
|---|---|---|---|---|---|---|---|---|---|
| X | Y | X | Y | X | Y | X | Y | X | Y |
| 4 | 37 | 25 | 34 | 39 | 38 | 49 | 35 | 48 | 29 |
| 3 | 13 | 20 | 13 | 34 | 11 | 41 | 15 | 39 | 13 |
| 0 | 0 | 16 | 2 | 25 | 2 | 29 | −8 | 25 | 0 |
| 3 | −18 | 15 | −14 | 25 | −13 | 31 | −11 | 23 | −14 |
| 4 | −59 | 17 | −47 | 30 | −54 | 33 | −49 | 24 | −56 |

(PIXELS)

(a) TEM IMAGE  (b) SPECTRAL IMAGE ial field. In recent years, in order to analyze defects in
TRANSMISSION ELECTRON MICROSCOPE
HAVING ELECTRON SPECTROMETER

TECHNICAL FIELD

The present invention relates to an electron microscope and, more particularly, to a transmission electron microscope having an electron spectrometer for spectrally dispersing an electron beam according to the amount of energy possessed by the beam.

BACKGROUND ART

As silicon semiconductors, magnetic devices, and so on have been manufactured in ever decreasing sizes and with ever increasing scales of integration, deteriorations of the device characteristics and reliability decrease have become greater issues. In recent years, in order to analyze defects in semiconductor devices in the nanometer regime and to locate and solve the causes of the defects in a fundamental manner in the course of development of novel processes and mass production, spectral analysis using (scanning) transmission electron microscopy ((S)TEM) and electron energy loss spectroscopy (EELS) and analysis of two-dimensional elemental distributions have become essential analytical means.

Electron energy loss spectra can be roughly classified into zero loss spectra in which no energy loss occurs in passing through the sample, plasmon loss spectra obtained by exciting electrons in valent electron bands and causing energy loss, and core loss spectra obtained by exciting inner shell electrons and causing energy loss. In a core loss spectrum, fine structures are observed near the absorption edges. The structures are known as energy loss near-edge structures (ELNES) and have information reflecting the electronic state of the sample and the state of chemical bonding. Furthermore, the energy loss values (positions of the absorption edges) are intrinsic to the element and so qualitative analysis can be performed. In addition, information related to the coordination around an element of interest can be obtained from shifts of the energy loss values known as chemical shifts. Consequently, a simple state analysis can also be performed.

In the past, in a case where an electron energy loss spectrum at a different location on a sample was obtained, the electron energy loss spectrum has been continuously acquired by combining a scanning transmission electron microscope for scanning a finely focused electron beam over the sample using scan coils with an electron spectrometer capable of spectral dispersion in terms of the amount of energy possessed by the electron beam and by spectrally dispersing the beam transmitted through the sample.

In the case of this technique, however, drift of the accelerating voltage of the electron beam caused by variations in external disturbances around the apparatus and variations in the magnetic and electric fields vary the aberrations in the electron spectrometer and the position of the origin of the electron energy loss spectrum. Therefore, it is difficult to compare the shapes of the energy loss near-edge structures of electron energy loss spectra at different measurement positions and weak chemical shifts.

Accordingly, patent literature 1 discloses that the focal position is made different between the x- and y-axes to thereby make the focal position on the x-axis and the focal position on the y-axis a spectral plane and an image plane, respectively, in contrast with a normal transmission electron microscope in which the focal positions on the x- and y-axes are placed at the same plane and a transmission electron microscope image is obtained.

As a result, all electron energy loss spectra of the sample in the y-axis direction can be separated and observed. In particular, an image obtained by a two-dimensional detector can be observed in such a way that the x-axis is an amount of energy loss and the y-axis is a spectral image 51 having positional information about the sample as shown in FIG. 16(b). The spectral image 51 is observed like a belt in a corresponding manner to lamination films observed with a transmission electron microscope (IEM) image 50 shown in FIG. 16(a). Consequently, electron energy loss spectra at different positions on the sample can be observed at the same time. The energy loss near-edge structures of electron energy loss spectra at different positions and weak chemical shifts can be compared in detail.

CITATION LIST

Patent Literatures

Patent Literature 1: JP-A-10-302700

SUMMARY OF INVENTION

Technical Problem

The spectral image disclosed in patent literature 1 (the x-axis is an energy loss amount and the y-axis has positional information about the sample) is a two-dimensional spectral image obtained by modifying the action of the lens such as an electron spectrometer such that the focal position is made different between the x- and y-axes and obtaining the image by a two-dimensional detector. That is, electron energy loss spectra at plural points in different positions on the sample can be observed at the same time. That is, in the case of the present technique, electron energy loss spectra can be obtained from plural points on a subject of analysis at the same time and so spectral fine structures and chemical shifts owing to differences in state of chemical bonds can be discussed in detail.

It is assumed, however, that in a zero-loss spectral image obtained by an electron beam experiencing no energy loss when passing through a sample or a spectral image derived from a sample of the same composition, spectral shapes at various positions in the y-axis direction, spectral positions, and so on are completely identical. Furthermore, it is assumed that zero-loss spectral images or spectral images obtained from samples of the same composition are completely identical from whatever positions on the x-axis they are derived, i.e., the direction of energy loss amount.

Additionally, the above-described spectral images must be obtained at the same magnification relative to a transmission electron microscope image in the y-axis direction, i.e., in all the Y-position directions of the sample, in order to simultaneously obtain electron energy loss spectra from plural points on the sample to be analyzed.

Accordingly, in order to solve the foregoing problem, it is indispensable that a two-dimensional electron beam position image formed by two orthogonal axes (the axis of the amount of energy loss and the axis of positional information) be obtained, compared with reference electron beam positions, then an amount of distortion be calculated based on the differences of the electron beam positions, and then the distortion in the spectral image of the sample to be analyzed be corrected based on the amount of distortion.

It is an object of the present invention to provide a method and apparatus being a transmission electron microscope having an electron spectrometer, the method consisting of obtaining a two-dimensional electron beam position image formed by two orthogonal axes (axis of the amount of energy loss and axis of positional information) and correcting the distortion in the spectral image of a sample to be analyzed efficiently and accurately based on differences with reference electron beam positions.

Solution to Problem

As a means for solving the above-described problem, the present invention provides a method of correcting distortion in a spectral image, the method comprising the steps of: obtaining a two-dimensional electron beam position image formed by an axis of the amount of energy loss and an axis of positional information, calculating electron beam positions from the electron beam position image, then comparing the positions with reference electron beam positions, calculating an amount of distortion in the spectral image based on differences of the electron beam positions, and correcting the distortion in the spectral image of a sample to be analyzed based on the amount of distortion.

As the method of correcting the distortion, a method using image processing or a method of correcting multipole lenses is used.

ADVANTAGEOUS EFFECTS OF INVENTION

According to the method and apparatus for correcting distortion in a spectral image of the present invention, the distortion in the spectral image of a sample to be analyzed can be corrected with high efficiency and high accuracy by comparing a two-dimensional electron beam position image formed by two orthogonal axes consisting of an axis of the amount of energy loss and an axis of positional information with reference electron beam positions, and calculating the amount of distortion based on the differences of electron beam positions. Furthermore, according to the invention, a transmission electron microscope equipped with an electron spectrometer capable of efficiently correcting the distortion can be offered.

BRIEF DESCRIPTION OF DRAWINGS

FIG. 14(a) indicates electron beam positions obtained from an electron beam position image; FIG. 14(b) indicates reference electron beam positions; and FIG. 14(c) indicates amounts of distortion.

DESCRIPTION OF EMBODIMENTS

Embodiments of the present invention are hereinafter described in detail with reference to the drawings. In all the figures for illustrating the embodiments, identical members are in principle indicated by the same symbols. Their repeated description is omitted.

Figure 1:
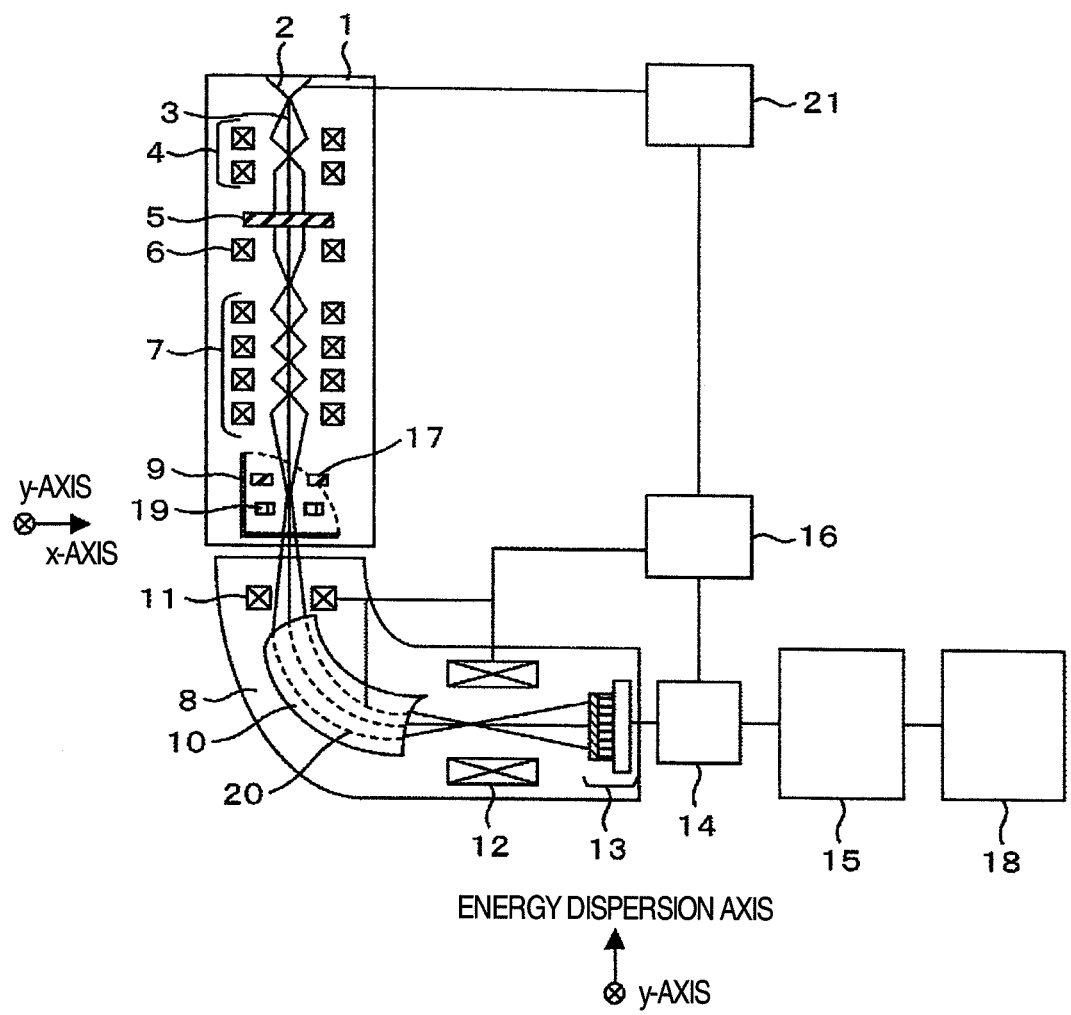
FIG. 1 is a schematic diagram showing one example of a transmission electron microscope having an electron spectrometer.

FIG. 1 is a schematic diagram showing one example of a transmission electron microscope equipped with an electron spectrometer being one embodiment according to the present invention.

The transmission electron microscope equipped with the electron spectrometer of the present embodiment is composed of a transmission electron microscope 1, the electron spectrometer 8, an image display device 14, a central control unit 16, a spectral image distortion correction apparatus 15, and others. The transmission electron microscope 1 has an electron source 2 emitting an electron beam 3, condenser lenses 4, an objective lens 6, an imaging lens system 7, a fluorescent screen 9, and so on. A sample 5 is disposed between the condenser lenses 4 and the objective lens 6. The electron spectrometer 8 has a magnetic sector 10, a drift tube 20, multipole lenses 11, 12, a two-dimensional detector 13, and so on.

The configuration of the transmission electron microscope 1 and the configuration of the electron spectrometer 8 are not limited to the foregoing. For example, the electron spectrometer 8 may be disposed within the transmission electron microscope 1.

Figure 16:
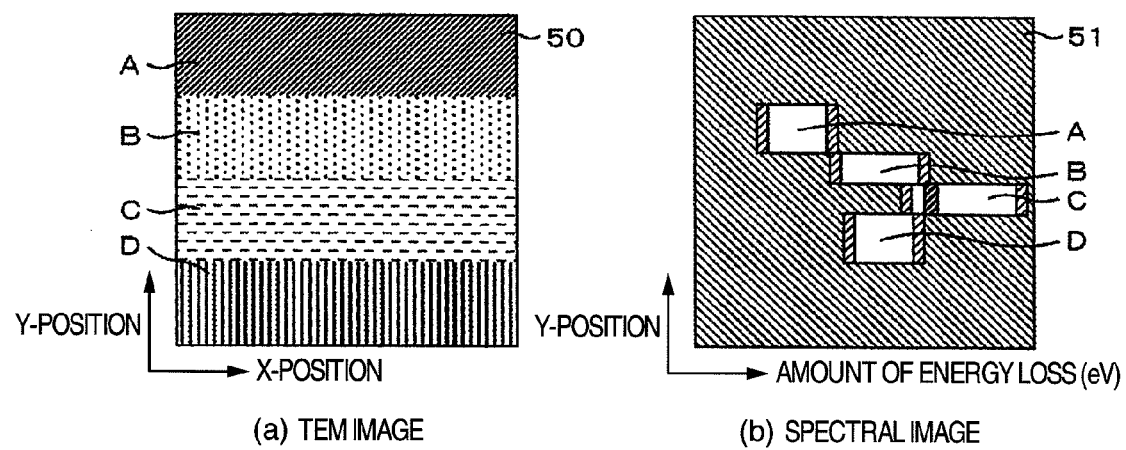
FIG. 16(a) is a transmission electron microscope image obtained by the prior art technique.
FIG. 16(b) is a spectral image.

In this transmission electron microscope equipped with the electron spectrometer, the electron beam 3 emitted by the electrons source 2 passes through the condenser lenses 4 and impinges on the sample 5. The electron beam 3 transmitted through the sample 5 passes through the objective lens 6 and through the imaging lens system 7 consisting of plural lenses. Where the fluorescent screen 9 is open, the beam intact passes into the electron spectrometer 8. The incident electron beam 3 passes through the multipole lenses 11 and 12 and magnetic sector 10 mounted in the electron spectrometer 8. The lenses 11 and 12 are used for focusing, enlargement, demagnification, aberration reduction, and for other purpose of electron energy loss spectra, transmission electron microscope images, and energy-selected images. The sector 10 is capable of spectral dispersion according to the amount of energy possessed by the electron beam 3. Then, the beam is acquired as a transmission electron microscope image, two-dimensional elemental distribution image, spectral image, or other image by the two-dimensional detector 13 and then displayed on the image display device 14. The magnetic sector 10, multipole lenses 11, 12, and drift tube 20 are controlled by the central control unit 16. The central control unit 16 can control switching of the acquisition mode in which a transmission electron microscope image, two-dimensional elemental distribution image, spectral image, or other image is obtained. In addition, the unit can control change of the focal positions on the x- and y-axes, i.e., switching of the acquisition mode in which the transmission electron microscope image 50 and spectral image 51 as shown in FIG. 16 are obtained.

Where the spectral image 51 is obtained, a field of view limiting slit 17 that is short in the x-axis direction (i.e., the energy dispersion direction) and long in the y-axis direction (i.e., a direction towards a sample measurement position) may be inserted to restrict the location where one wants to obtain the spectral image 51.

Before the spectral image 51 of the analyzed specimen within the sample 5 is acquired, a two-dimensional electron position image formed by the axis of energy loss amount and the axis of positional information is obtained. The image is compared with reference electron beam positions by the spectral image distortion correction apparatus 15 and amounts of distortion based on the differences of the electron beam positions are stored. Then, the spectral image 51 of the analyzed specimen within the sample 5 is obtained by the two-dimensional detector 13. The spectral image 51 of the analyzed specimen is corrected based on the amounts of distortion stored in the spectral image distortion correction apparatus 15 and then stored in a data storage device 18.

Where the above-described two-dimensional electron beam position image is obtained, an aperture 19 is inserted into the electron beam path. Also, the electron beam position image is derived while varying the accelerating voltage of the electron beam 3 emitted from the electron source 2 by an accelerating voltage varying device 21.

Figure 3:
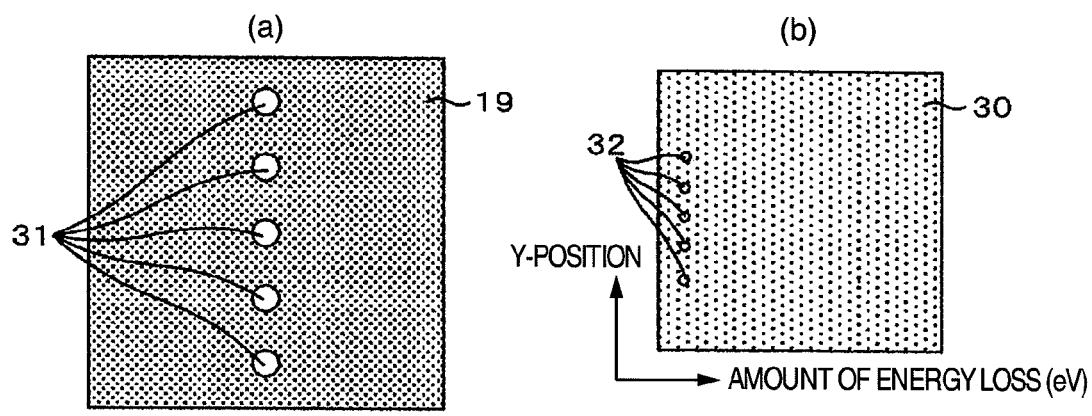
FIG. 3(a) is a schematic diagram of an aperture.
FIG. 3(b) is an electron beam position image obtained with a transmission electron microscope having an electron spectrometer by inserting the aperture.

FIG. 3 shows the aperture 19 having plural openings 31 and an electron beam position image 30 obtained by recording the electron beam 3 passed through the openings 31 of the aperture 19 with the two-dimensional detector 13. In the present electron beam position image 30, recorded beam positions 32 are recorded in locations close to the left side of the two-dimensional image. No restrictions are imposed on the positions. The positions may be recorded anywhere within the two-dimensional image. Furthermore, no restrictions are placed on the number of the openings 31.

Where the electron beam position image 30 is obtained, it is obtained while varying the accelerating voltage by the accelerating voltage varying device 21. In addition, the electron beam position image 30 may also be obtained while varying the voltage on the drift tube 20 mounted in the electron spectrometer 8. Preferably, the openings 31 in the aperture 19 are arranged in a direction perpendicular to the direction of energy dispersion. The shape of each opening 31 is not restricted to circular form.

Figure 2:
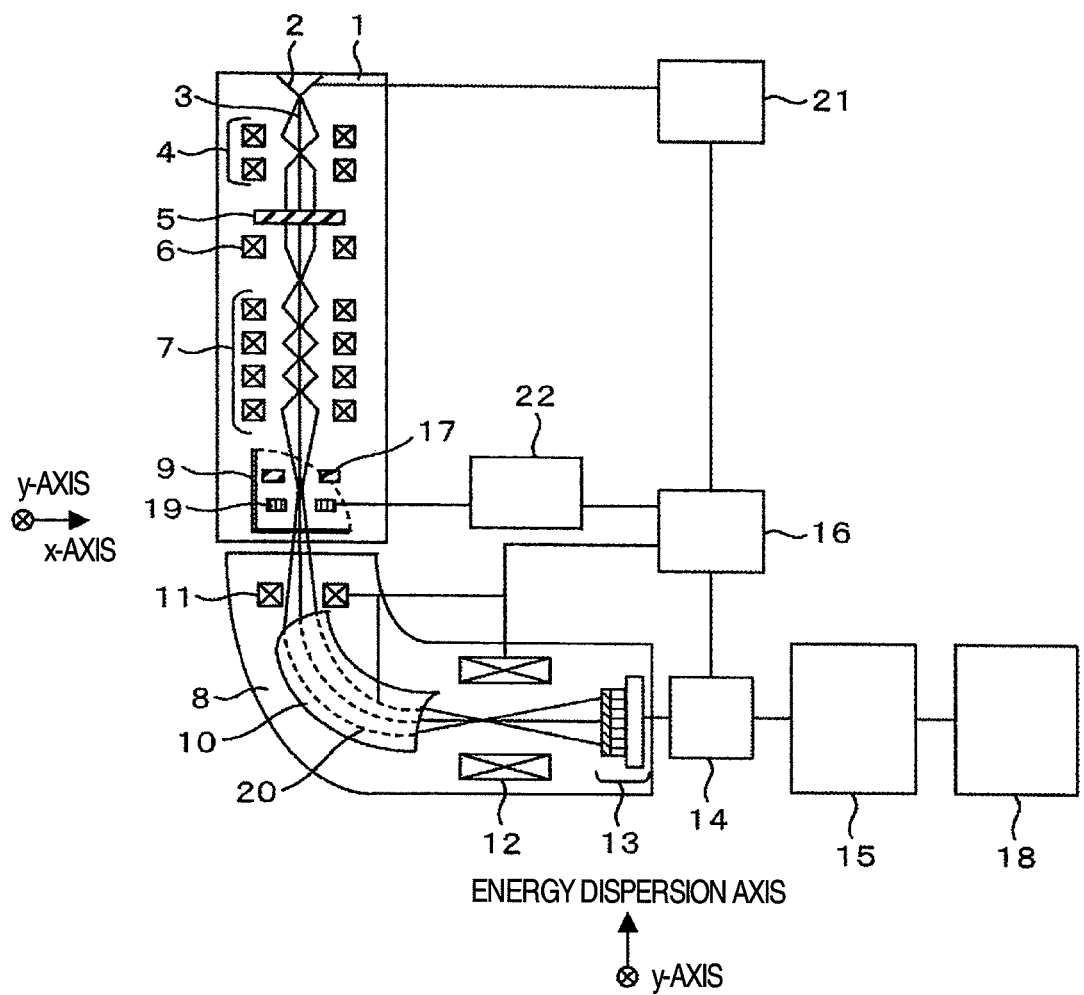
FIG. 2 is a schematic diagram showing one example of a transmission electron microscope having an electron spectrometer.
Figure 4:
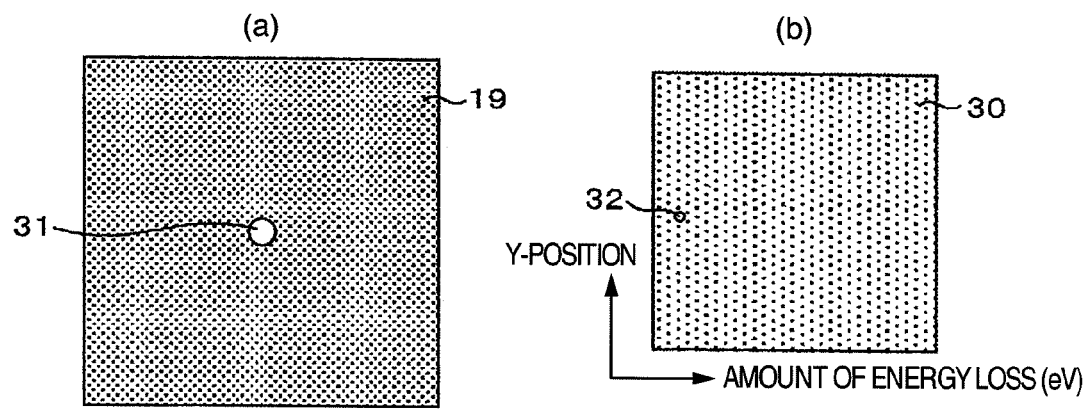
FIG. 4(a) is a schematic diagram of an aperture.
FIG. 4(b) is an electron beam position image obtained with a transmission electron microscope having an electron spectrometer by inserting the aperture.

FIG. 2 is an example of transmission electron microscope having an aperture moving device 22. Where there is the aperture moving device 22, the aperture 19 may suffice to have a single opening 31 as shown in FIG. 4, in which case the aperture is movable in a direction perpendicular to the direction of energy dispersion. Where the aperture 19 has the aforementioned plural openings 31, the present aperture moving device 22 may be used as a rotating mechanism for disposing the openings 31 in a direction perpendicular to the direction of energy dispersion.

Figure 5:
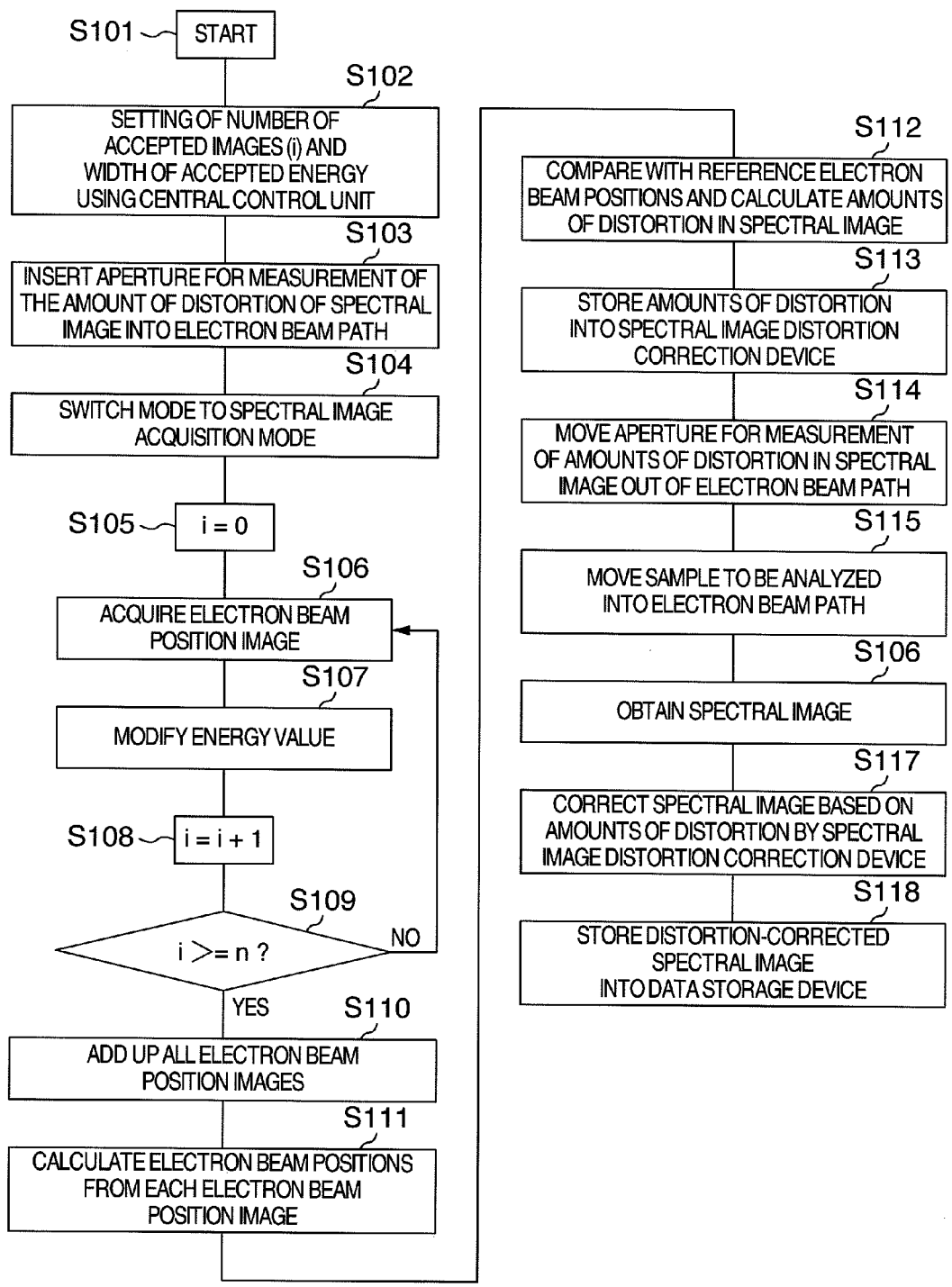
FIG. 5 is a flowchart illustrating a procedure for correcting distortion in a spectral image, the procedure being carried out by a transmission electron microscope having an electron spectrometer.

FIG. 5 is a flowchart illustrating a procedure for correcting distortion in a spectral image of a sample to be analyzed after measurement of the amount of the distortion in the spectral image, by the use of the spectral image distortion correction apparatus 15. Although the amount of distortion in the spectral image may be measured using an electron beam transmitted through the measurement position of the spectral image of the sample to be analyzed, in a case where sample damage due to the electron beam is problematic, measurements may also be made using an electron beam transmitted through locations other than the sample to be analyzed.

First, the number of accepted electron beam position images 30 and the energy value during the acceptance are set into the central control unit 16. The set energy value modifies the accelerating voltage of the electron beam 3 imposed by the accelerating voltage varying device 21, the voltage on the drift tube 20 lying in the electron spectrometer 8, or other value. After setting the number and energy value, the aperture is inserted into the electron beam path for measurement of the amount of distortion (S101 to S103).

Then, the mode is switched to the acquisition mode in which a spectral image is obtained (S104). The electron beam 3 passed through the aperture 19 is obtained as an electron beam position image 30 by the two-dimensional detector 13. Electron beam position images 30 are successively derived for each set energy value (S105 to S109).

Thereafter, all the electron beam position images 30 obtained for each set energy value are summed up to create one electron beam position image 30. It is not necessary that the set energy values be identical in energy width. Any arbitrary energy values can be selected (S110).

Then, each electron beam position 32 is calculated using the aforementioned electron beam position image 30. During the calculation of the electron beam positions 32, a region close to each electron beam position is specified. A maximum value or the position of the center of gravity within the region is taken as an electron beam position (S111). Note that the calculation of the electron beam position is not limited to this method.

Reference electron beam positions and the electron beam positions found as described just above are compared. The amounts of deviation from the reference electron beam positions, i.e., the amounts of distortion in the spectral image, are computed and stored in the spectral image distortion correction apparatus 15 (S112 and S113).

The reference line positions are so set that the amounts of energy loss at the positions of the electron beam passed through the openings are identical at each energy value. Furthermore, the reference line positions are so set that the positions of the electron beam passed through the openings are the same Y-position if the energy value is varied.

A location from which one wants to obtain a spectral image of a sample to be analyzed is moved into the electron beam path, and the desired spectral image 51 is obtained and stored in the spectral image distortion correction apparatus 15. Distortion in the spectral image is corrected based on the amounts of distortion recorded in the spectral image distortion correction apparatus 15. The corrected spectral image is stored in the data storage device 18 (S114 to S118).

The measurement of the amount of distortion in the present spectral image is preferably carried out immediately prior to acquisition of a spectral image of a desired subject of analysis. Where there is no great variation in the distortion in the spectral image, it is not necessary to obtain a spectral image from each sample whenever a measurement is made. The measurement may be carried out only when the instrument is installed and the result may be stored in the spectral image distortion correction apparatus 15.

Figure 6:
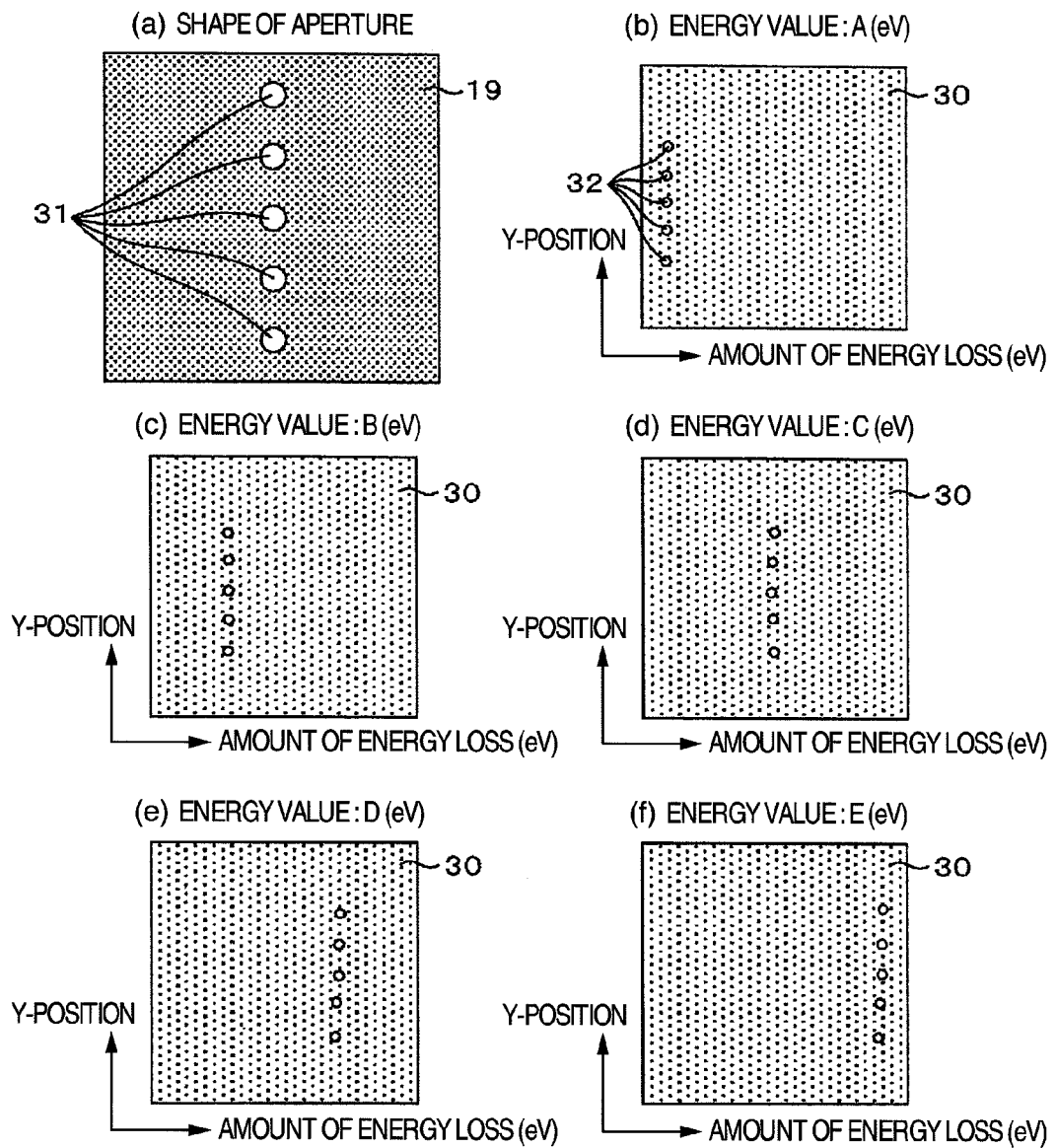
FIG. 6(a) is a schematic diagram of an aperture.
FIGS. 6(b)-6(f) are electron beam position images obtained with a transmission electron microscope having an electron spectrometer by inserting the aperture.
Figure 7:
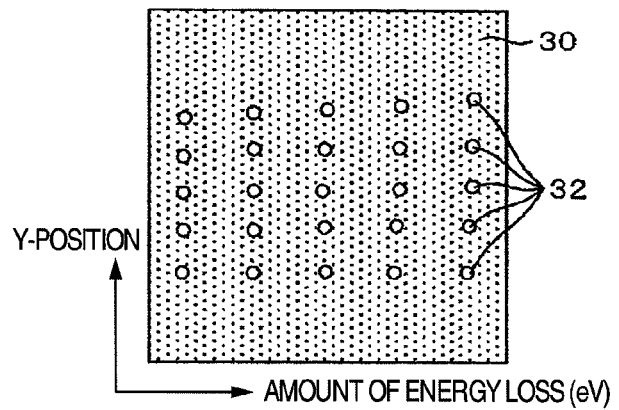
FIG. 7 is an electron beam position image obtained with a transmission electron microscope having an electron spectrometer by inserting an aperture.

FIG. 6 shows the electron beam position image 30 displayed on the image display device 14 when the flowchart of FIG. 5 is implemented. It is assumed that the set energy values are A, B, C, D, and E eV, respectively. The number of openings 31 in the aperture 19 is five. Where the set energy value is A eV, the electron beam position 32 is displayed on the left side of the electron beam position image 30. Then, the energy value is changed to B, C, D, and E eV in turn. Concomitantly, the electron beam position is moved to the right. After recording all the electron beam position images 30 for the set energy values, all the electron beam position images 30 are summed up. The resulting image is shown in FIG. 7.

Figure 8:
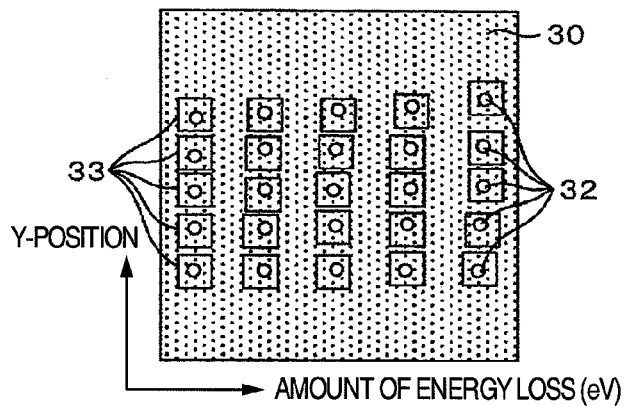
FIG. 8 is an electron beam position image obtained with a transmission electron microscope having an electron spectrometer by inserting an aperture.

FIG. 8 is an example of display in a case where the electron beam positions 32 are computed from the electron beam position image 30 summed up. An electron beam position measurement region 33 for precisely finding the electron beam positions 32 is set near the beam positions 32. A maximum value, a value of the center of gravity, or the like within this range is taken as an electron beam position and calculated using the number of pixels of the displayed image.

Figure 9:
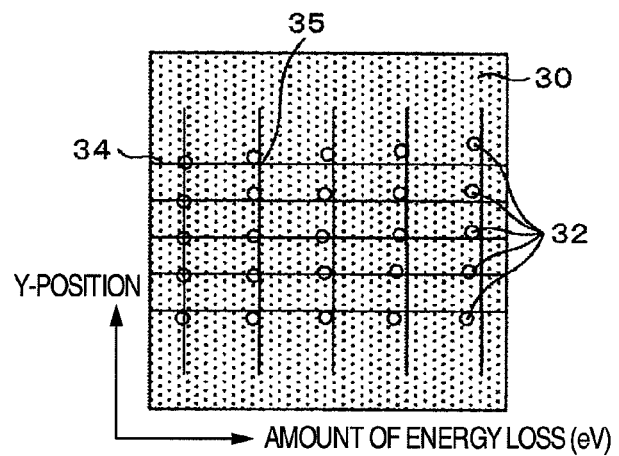
FIG. 9 is an electron beam position image obtained with a transmission electron microscope having an electron spectrometer by inserting an aperture.

FIG. 9 is an example of display showing the reference electron beam positions. The intersections of reference lines 34 are reference electron beam positions 35. It is possible to instantly judge whether the spectral image is distorted by presenting the present reference lines 34 relative to the sum electron beam position image 30 of all the electron beam position images 30 acquired from the set energy values.

Figure 10:
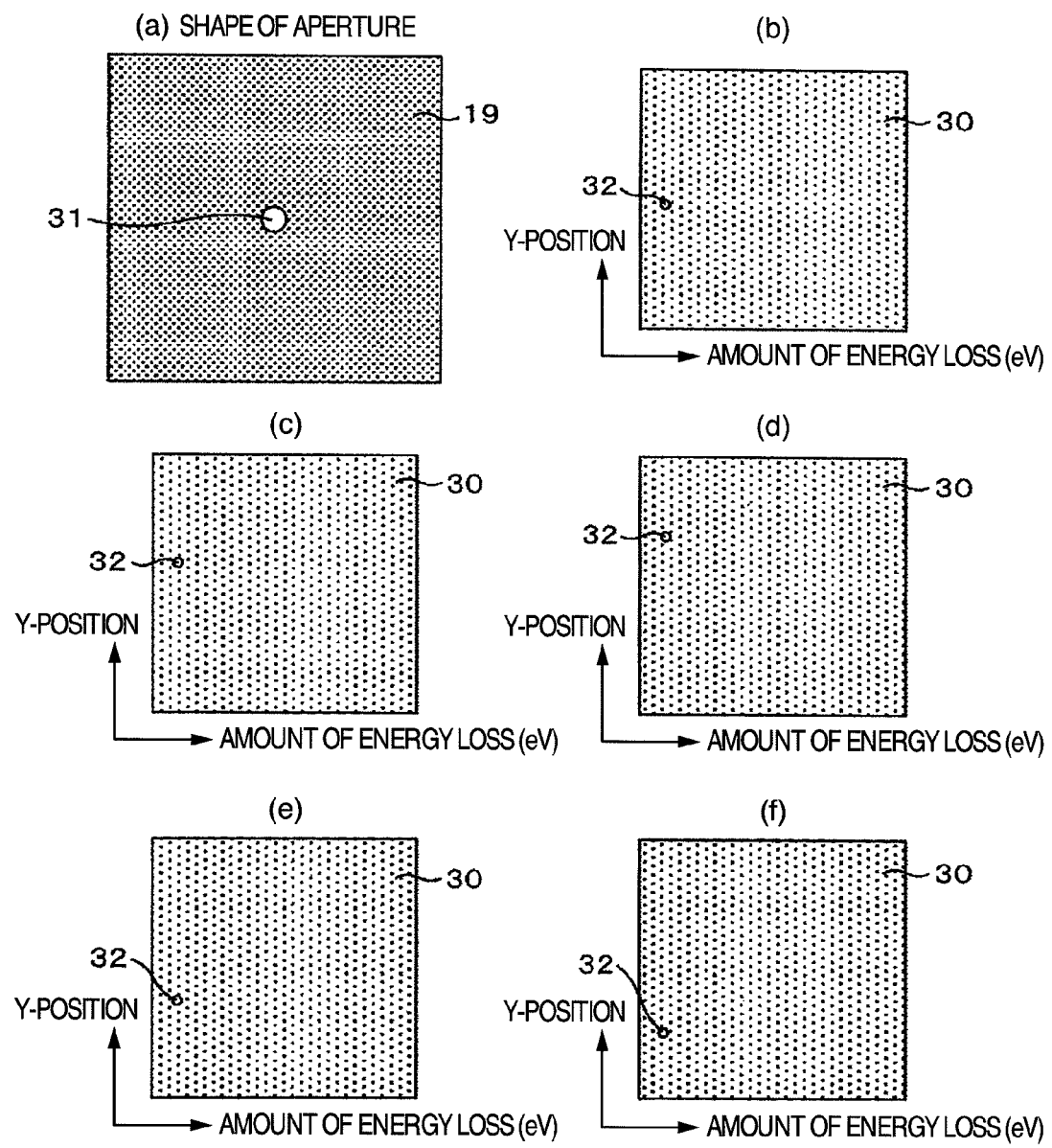
FIG. 10(a) is a schematic diagram of an aperture.
FIGS. 10(b)-10(f) are electron beam position images obtained with a transmission electron microscope having an electron spectrometer by inserting the aperture.

FIG. 10 is an example in which the electron beam position image 30 is shown in a case where there is one opening 31 in the aperture 19. Where there is one opening 31 in the aperture 19, the aperture 19 is moved in the Y-position direction by the aperture moving device 22 for the same energy value as described previously and the electron beam position image 30 is obtained whenever the aperture 19 is moved. FIGS. 10(b)-10(f) show electron beam position images 30 when the aperture 19 is moved in the Y-position direction. The electron beam position 32 moves in a corresponding manner to the position of the aperture 19.

Figure 11:
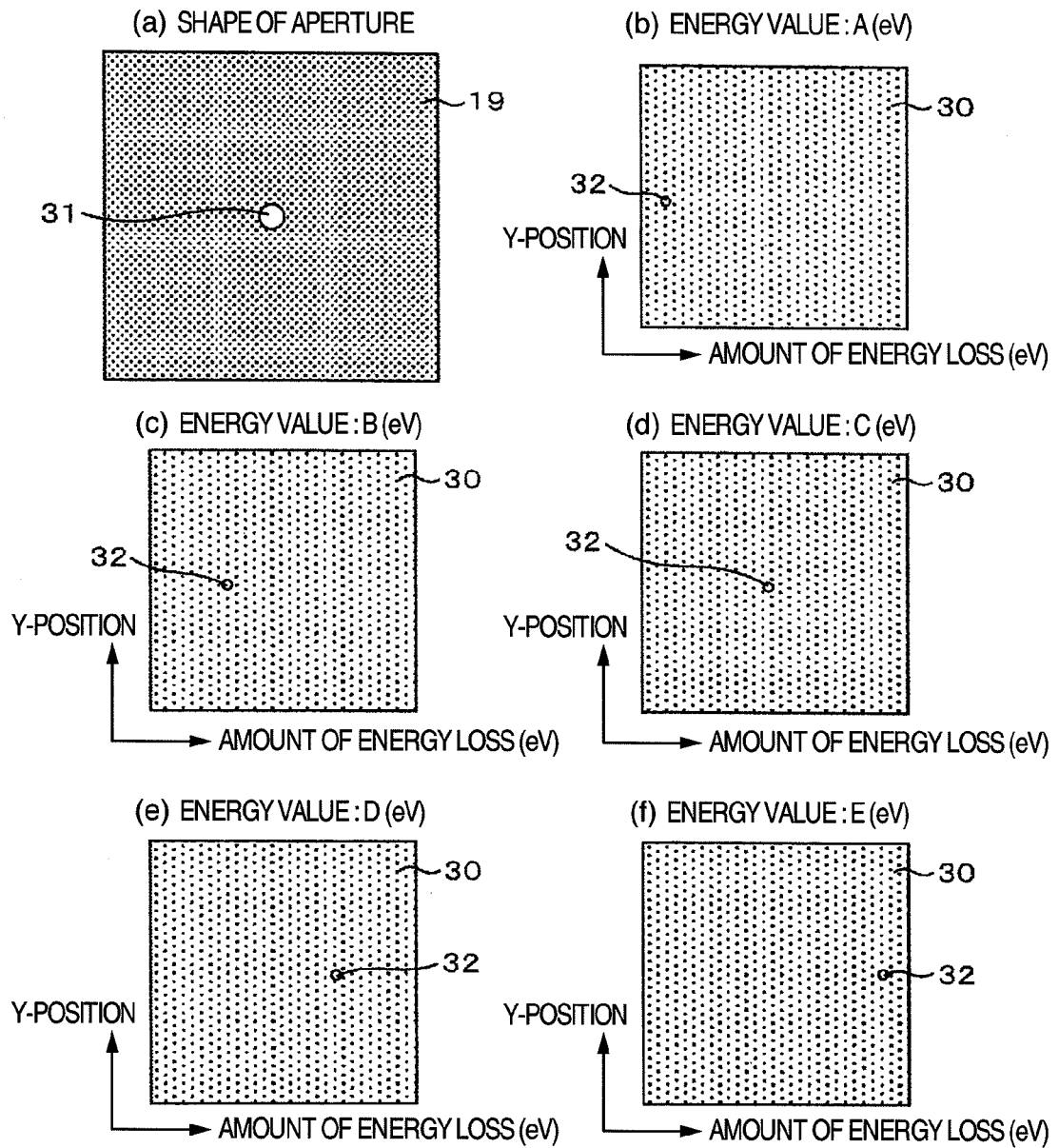
FIG. 11(a) is a schematic diagram of an aperture.
FIGS. 11(b)-11(f) are electron beam position images obtained with a transmission electron microscope having an electron spectrometer by inserting the aperture.

FIG. 11 is an example in which the electron beam position image 30 is shown in a case where the energy value is varied under the condition where the aperture 19 has a single opening 31. If the electron beam position image 30 is obtained whenever the energy value is varied from A to E, the electron beam position 32 moves from the left side to the right side. As mentioned previously, even where there is one opening 31 in the aperture 19, it is possible to obtain the electron beam position image 30 for measuring the amount of distortion by changing the energy value while moving the aperture 19 in the Y-position direction by the aperture moving device 22.

Figure 12:
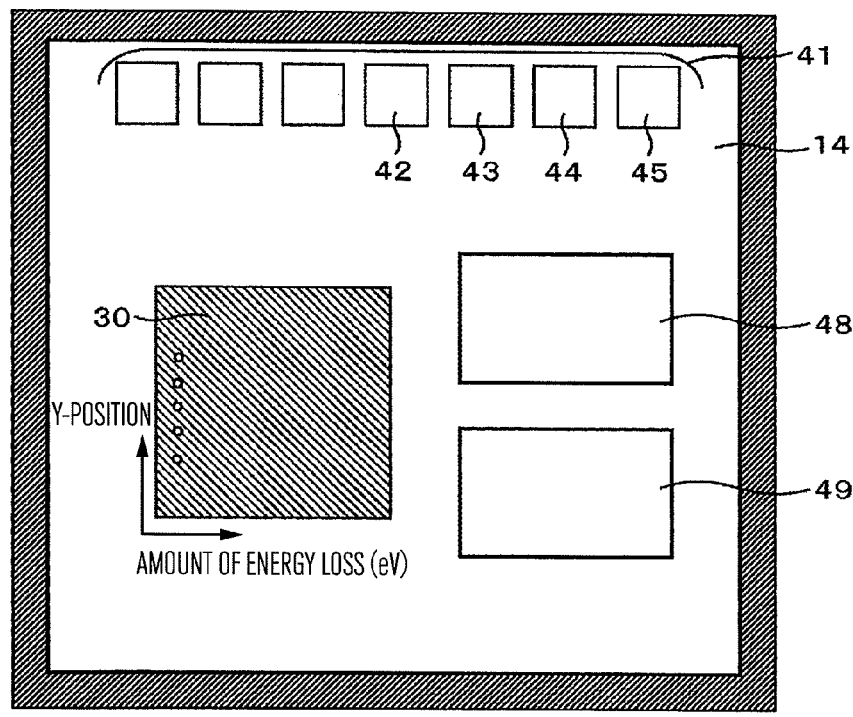
FIG. 12 is a view showing one example of image display device in a transmission electron microscope having an electron spectrometer.

Manipulations performed by an operator and one example of screen giving instructions as to manipulations of an electron microscope equipped with an electron spectrometer are next described. FIG. 12 is a view showing one example of the content of display within the image display device 14. A set of select buttons 41 includes a spectral image acceptance starting button 42, a spectral image acceptance ending button 43, a spectral acceptance time change button/spectral image distortion measurement button 44, and a spectral image distortion correction button 45. For example, if the spectral image acceptance starting button 42 is selected out of the set of select buttons 41, the spectral image 51 is acquired by the two-dimensional detector 13 and displayed within the image display device 14.

If the spectral image distortion measurement button 44 is selected from within the set of select buttons 41, a parameter setting diagram 48 is displayed to set the number of accepted spectra and the energy value for measuring the amount of distortion in each spectral image. After setting parameters according to the setting diagram, the electron beam position images 30 are obtained in turn according to the flowchart of FIG. 5. After adding up all the obtained electron beam position images, the amount of distortion in the spectral image is measured. The results of the measurement of the amount of distortion are displayed on a result display diagram 49. Then, a spectral image 51 of the sample to be analyzed is acquired. Thereafter, if the spectral image distortion correction button 45 is selected, the distortion in the spectral image 51 of the sample to be analyzed is corrected and then stored in the data storage device 18. The corrected spectral image 51 may be immediately displayed on the image display device 14. If not necessary, the image does not need to be displayed.

The aforementioned buttons of various functions can be appropriately moved and arranged within the image display device 14. Furthermore, the buttons of the functions may be toolbars. Additionally, they may also be arranged at will in the electron beam position image 30, parameter setting diagram 48, or the like displayed within the image display device 14.

A specific example of correction of distortion in the above-described spectral image is next described. In the present specific example, the correction was carried out using the transmission electron microscope 1 equipped with the electron spectrometer 8. The distortion in the spectral image 51 was corrected using the spectral image distortion correction apparatus 15 of the present invention.

The accelerating voltage of the transmission electron microscope 1 at the time of acquisition of a spectral image was set to 197 kV. The acceptance angle of the electron beam 3 was set to 4.4 mrad. The energy dispersion was set to 0.05 eV/pixel. The two-dimensional detector 13 used for the acquisition of the spectral image is a two-dimensional detector of 2048 pixels×2048 pixels. A final magnification on the display of the transmission electron microscope was set to ×10,000.

In the case of the aforementioned final magnification of the transmission electron microscope, the image resolution of the spectral image in the Y-position direction was 0.2 nm/pixel, the image having been obtained by the two-dimensional detector 13.

Accordingly, the sample 5 was moved out of the path of the electron beam 3, and the mode was switched to the spectral image mode. Then, adjustments were made such that the multipole lenses 11 and 12 were placed in optimum conditions while referring to the zero loss spectral image displayed on the image display device 14.

Then, the aperture 19 was inserted into the electron beam path. On this occasion, the aperture 19 having five openings in a direction perpendicular to the direction of energy dispersion, i.e., in the Y-position direction, was used. Then, the spectral image distortion measurement button 24 was selected, and the number of accepted images and the energy value were set. In the present specific example, the number of accepted images was set to five, and the widths of the set energy values were set at equal intervals of 80 eV. That is, it was determined to acquire electron beam position images at energy values of 0, 40, 80, 120, and 160 eV.

Figure 13:
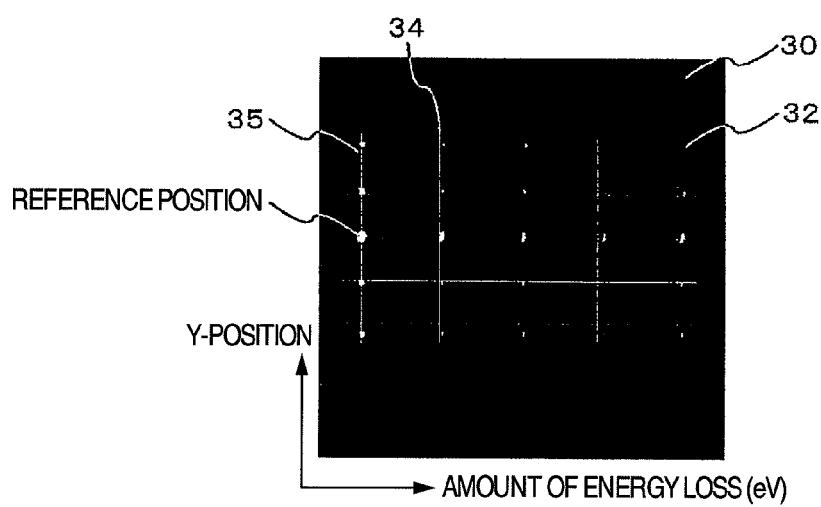
FIG. 13 is an electron beam position image obtained with a transmission electron microscope having an electron spectrometer by inserting an aperture.

After setting the number of accepted images and the energy values, electrons beam position images were acquired in turn. Then, all the electron beam position images were summed up. Shown in FIG. 13 is an electron beam position image 30 obtained after summing up all the electron beam position images. The reference lines 34 are shown on the electron beam position image 30. It was revealed from the results that the electron beam positions 32 deviated from the reference electron beam positions 35 and that the spectral image was distorted. Therefore, the amount of distortion in the spectral image was measured in detail.

Electron beam positions at various locations were measured from the electron beam position image 30 obtained in the present specific example, and the results are in FIG. 14(a). FIG. 14(b) shows the reference electron beam positions. In the present specific example, the amount of distortion was computed from a comparison with the reference electron beam positions. Results shown in FIG. 14(c) were obtained and stored in the spectral image distortion correction apparatus 15. The present results indicate the amounts of distortion of the reference positions shown in FIG. 13 from the electron beam positions.

The amount of correction can be graphed based on the results of the analysis. For example, the amount of correction can be graphed by plotting energy values on the x-axis, Y-positions on the y-axis, and the amount of correction on the z-axis. Consequently, the amounts of correction at arbitrary energy values and Y-positions can be found.

Figure 15:
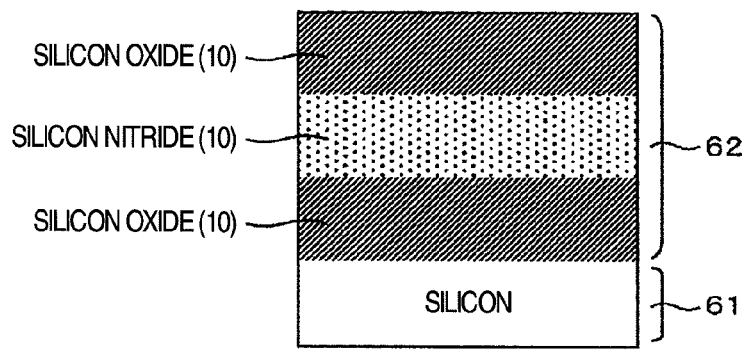
FIG. 15 is a schematic view of a sample used for analysis.

Then, the desired sample 5 to be analyzed was moved into the electron beam path. Thereafter, the spectral image acceptance starting button 42 was selected and spectral images were acquired. A schematic view of the sample used for an analysis is shown in FIG. 15. A multilayer film was laminated on a substrate 61 to prepare the sample 5. The substrate 61 was silicon. The films of the multilayer film 62 on the substrate were silicon oxide (10 nm), silicon nitride (10 nm), and silicon oxide (10 nm) in this order. The measured spectral images were close to the absorption edges of the L-shell of silicon.

Each spectral image was accepted for 20 seconds. For the present measurements, the field of view limiting slit 17 was inserted to limit the analyzed location.

After obtaining a spectral image, the spectral image distortion correction button 45 was selected. The distortion in the spectral image was corrected based on the amounts of distortion stored in the spectral image distortion correction apparatus 15. A bilinear method was used for the correction of the distortion. Furthermore, a correction of the intensity was carried out concomitantly with the distortion correction. The present method was used this time. The manner in which a distortion is corrected is not restricted to the present technique. As a result of the correction of the distortion, electron energy loss spectra at various locations corresponding to transmission electron microscope images were obtained all accurately.

In the present embodiment, spectral images were obtained after adjusting the multipole lenses 11 and 12 in the electron spectrometer to optimum conditions. Even where no adjustment is made, a similar correction to distortion in spectral images can be made.

Furthermore, after measurements of distortions in spectral images are carried out, the multipole lenses 11 and 12 in the electron spectrometer may be readjusted based on the amounts of distortion. Then, a desired spectral image may be obtained.

In the present embodiment, one spectral image was acquired in an acceptance time of 20 seconds. Where the S/N (signal-to-noise ratio) of the spectral image is poor, plural spectral images may be obtained and then corrections may be made for drift (movement) in the direction of energy of the spectral image and for drift (movement) in the positional direction. The spectral images may be summed up. In this case, the acceptance time and the number of accepted images can be set at will in the central control unit 16. Distortion correction of spectral image by the spectral image distortion correction apparatus 15 is carried out for each obtained spectral image. Then, drift between the distortion-corrected spectral images may be corrected and then the images may be summed up. Alternatively, all the spectral images may be corrected for drift and summed up and then a distortion correction may be carried out. The acquisition time in which a single spectral image is obtained is preferably set to such a time that the effects of energy drift and sample drift are small.

After obtaining plural spectral images which are relatively immune to energy drift and sample drift, energy drift between the spectral images and the sample drift are corrected and the images are summed up. Thus, an accurate spectral image can be obtained. Consequently, the accuracy of analysis of spectra at various locations can be improved. Furthermore, spectra of trace amounts of elements contained can be analyzed.

When energy drift and sample drift are corrected, it is better to calculate the amounts of drift at the position of a spectral image at which the kind of the lamination film varies.

While the invention made by the present inventor has been described specifically based on its embodiments, the invention is not restricted to the embodiments. It is obvious that the invention can be modified variously without departing from the gist.

REFERENCE SIGNS LIST

1: transmission electron microscope
2: electron source
3: electron beam
4: condenser lenses
5: sample
6: objective lens
7: imaging lens system
8: electron spectrometer
9: fluorescent screen
10: magnetic sector
11, 12: multipole lenses
13: two-dimensional detector
14: image display device
15: spectral image distortion correction apparatus
16: central control unit
17: field of view limiting slit
18: data storage device
19: aperture
20: drift tube
21: accelerating voltage varying device
22: aperture moving device
30: electron beam position images
31: opening(s)
32: electron beam positions
33: electron beam position measuring region
34: reference lines
35: reference electron beam positions
41: set of select buttons
42: spectral image acceptance starting button
43: spectral image acceptance ending button
44: spectral image distortion measurement button
45: spectral image distortion correction button
48: parameter setting diagram 49: result display diagram
50: TEM image
51: spectral image
61: substrate
62: multilayer film

The invention claimed is:

1. A transmission electron microscope having:
an electron gun for emitting an electron beam at a sample;
a set of condenser lenses for focusing the electron beam emitted from the electron gun;
a set of imaging lenses for imaging the electron beam transmitted through the sample; and
an electron spectrometer for spectrally dispersing the electron beam according to an amount of energy possessed by the electron beam transmitted through the sample;
wherein said electron spectrometer is an electron spectrometer that outputs a spectral image which is different in focal position between a direction of energy dispersion and a direction perpendicular to the direction of energy dispersion;
wherein said transmission electron microscope comprises:
an accelerating voltage varying device for varying an accelerating voltage of the electron beam,
an aperture for limiting a region through which the electron beam passes,
a two-dimensional detector for detecting a transmission electron microscope image or the spectral image,
an image display device for displaying the spectral image, and
a correcting device for measuring and correcting distortion in the spectral image;
wherein the two-dimensional detector is constructed to detect the electron beam transmitted through the aperture at various set values for the accelerating voltage of the transmission electron microscope, an electron beam position image being formed based thereon; and
wherein the correction device is constructed to calculate electron beam positions from said electron beam position image and to correct the spectral image of the sample based on deviations between each of the calculated electron beam positions and a corresponding reference electron beam position.

2. The transmission electron microscope of claim 1, wherein said aperture has plural openings in a direction perpendicular to the direction of energy dispersion.

3. The transmission electron microscope of claim 1, further comprising an aperture moving device for moving said aperture.

4. The transmission electron microscope of claim 1, further comprising a control unit configured to obtain a plurality of spectral images, to correct drift in a direction of energy and in a positional direction of the plurality of spectral images, and to sum up the plurality of spectral images after the correction.

5. A method of correcting distortion in a spectral image formed by two orthogonal axes one of which is an axis of the amount of energy loss obtained by a transmission electron microscope having an electron spectrometer and the other of which is an axis of positional information, said method comprising the steps of:
detecting an electron beam transmitted through an aperture by a two-dimensional detector while varying an accelerating voltage of the transmission electron microscope based on set values and obtaining a two-dimensional electron beam position image formed by the axis of the amount of energy loss and the axis of positional information;
calculating electron beam positions from the electron beam position image;
then comparing the electron beam positions with reference electron beam positions;
calculating amounts of distortion in the spectral image based on differences of the electron beam positions; and
correcting the distortion in the spectral image based on the amounts of distortion.

6. A method of correcting distortion in a spectral image as set forth in claim 5, wherein the distortion in said spectral image is corrected by multipole lenses based on said amounts of distortion.

7. A method of correcting distortion in a spectral image as set forth in claim 5, wherein the distortion in a spectral image of a subject of analysis is corrected based on said amounts of distortion.

8. A method of correcting distortion in a spectral image formed by two orthogonal axes one of which is an axis of the amount of energy loss obtained by a transmission electron microscope having an electron spectrometer and the other of which is an axis of positional information, said method comprising the steps of:
obtaining a two-dimensional electron beam position image formed by the axis of the amount of energy loss and the axis of positional information;
calculating electron beam positions from the electron beam position image;
then comparing the electron beam positions with reference electron beam positions;
calculating amounts of distortion in the spectral image based on differences of the electron beam positions; and
correcting the distortion in the spectral image of a sample to be analyzed based on the amounts of distortion.

* * * * *